(12) United States Patent
Liu et al.

(10) Patent No.: US 11,217,538 B2
(45) Date of Patent: Jan. 4, 2022

(54) INTEGRATED CIRCUIT PACKAGE AND METHOD

(71) Applicant: Taiwan Semiconductor Manufacturing Company, Ltd., Hsinchu (TW)

(72) Inventors: Chung-Shi Liu, Hsinchu (TW); Jiun Yi Wu, Zhongli (TW); Chien-Hsun Lee, Chu-tung Town (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/408,620

(22) Filed: May 10, 2019

(65) Prior Publication Data

US 2020/0176397 A1    Jun. 4, 2020

Related U.S. Application Data

(60) Provisional application No. 62/773,455, filed on Nov. 30, 2018.

(51) Int. Cl.
*H01L 23/00* (2006.01)
*H01L 23/538* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 21/78* (2013.01); *H01L 23/3128* (2013.01); *H01L 23/5383* (2013.01); *H01L 23/5386* (2013.01); *H01L 23/5389* (2013.01);
(Continued)

(58) Field of Classification Search
CPC ...................................................... H01L 24/19
See application file for complete search history.

(56) References Cited

U.S. PATENT DOCUMENTS 8,361,842 B2    1/2013 Yu et al.
8,680,647 B2    3/2014 Yu et al.
(Continued)

FOREIGN PATENT DOCUMENTS

CN    101728347 A    6/2010
CN    103474402 A    12/2013
(Continued)

*Primary Examiner* — Christopher A Johnson
(74) *Attorney, Agent, or Firm* — Slater Matsil, LLP

(57) ABSTRACT

In an embodiment, a device includes: an integrated circuit die; an encapsulant at least partially encapsulating the integrated circuit die; a conductive via extending through the encapsulant; a redistribution structure on the encapsulant, the redistribution structure including: a metallization pattern electrically coupled to the conductive via and the integrated circuit die; a dielectric layer on the metallization pattern, the dielectric layer having a first thickness of 10 μm to 30 μm; and a first under-bump metallurgy (UBM) having a first via portion extending through the dielectric layer and a first bump portion on the dielectric layer, the first UBM being physically and electrically coupled to the metallization pattern, the first via portion having a first width, a ratio of the first thickness to the first width being from 1.33 to 1.66.

20 Claims, 27 Drawing Sheets

(51) Int. Cl.
- *H01L 25/10* (2006.01)
- *H01L 25/00* (2006.01)
- *H01L 21/48* (2006.01)
- *H01L 21/56* (2006.01)
- *H01L 21/78* (2006.01)
- *H01L 23/31* (2006.01)

(52) U.S. Cl.
CPC .............. *H01L 24/19* (2013.01); *H01L 24/20* (2013.01); *H01L 25/105* (2013.01); *H01L 25/50* (2013.01); H01L 2224/214 (2013.01); H01L 2225/1035 (2013.01); H01L 2225/1058 (2013.01); H01L 2924/351 (2013.01); H01L 2924/3841 (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,716,084 | B2 | 7/2017 | Raorane et al. |
| 10,332,855 | B2 | 6/2019 | Lee et al. |
| 2004/0040855 | A1* | 3/2004 | Batinovich ......... H01L 21/2885 205/123 |
| 2011/0079897 | A1 | 4/2011 | Park et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0223014 | A1* | 8/2013 | Lin ................... H01L 23/49838 361/728 |
| 2013/0307140 | A1 | 11/2013 | Huang et al. |
| 2014/0138854 | A1 | 5/2014 | Arora |
| 2014/0203429 | A1 | 7/2014 | Yu et al. |
| 2014/0225222 | A1 | 8/2014 | Yu et al. |
| 2014/0252608 | A1* | 9/2014 | Chen .................... H01L 23/481 257/738 |
| 2014/0252646 | A1 | 9/2014 | Hung et al. |
| 2014/0264930 | A1 | 9/2014 | Yu et al. |
| 2014/0339699 | A1* | 11/2014 | Arvin ................ H01L 23/49866 257/738 |
| 2016/0027747 | A1 | 1/2016 | Ryu et al. |
| 2016/0181217 | A1 | 6/2016 | Prack |
| 2018/0269188 | A1* | 9/2018 | Yu ....................... H01L 23/5384 |
| 2019/0035754 | A1 | 1/2019 | Uesaka |

FOREIGN PATENT DOCUMENTS

| | | |
|---|---|---|
| KR | 20110036354 A | 4/2011 |
| KR | 20180105560 A | 9/2018 |
| TW | 201830601 A | 8/2018 |
| WO | 2017179574 A1 | 10/2017 |

\* cited by examiner

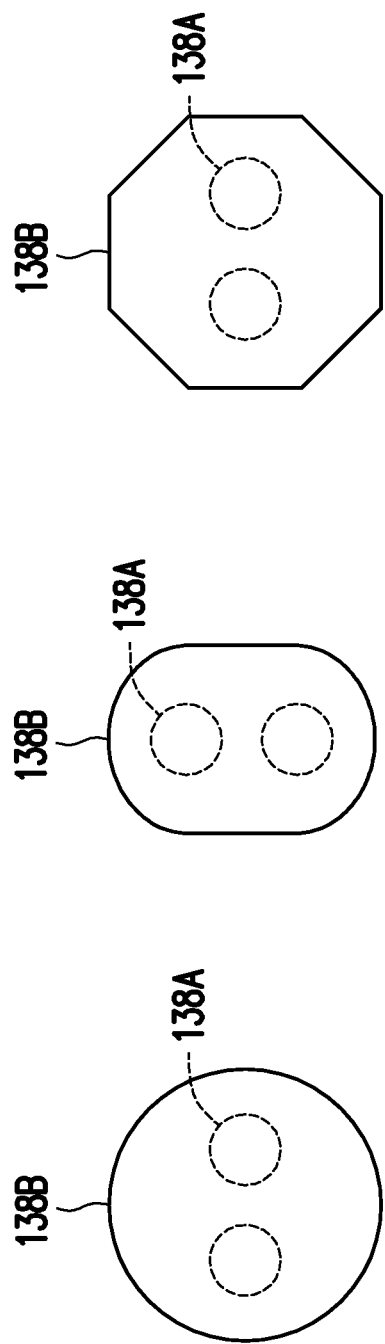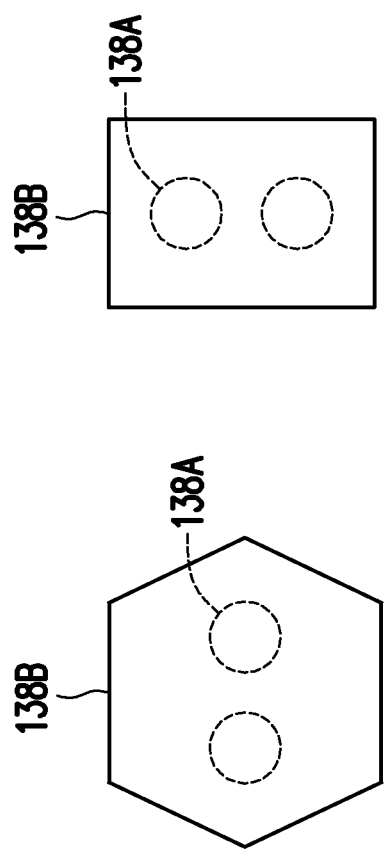

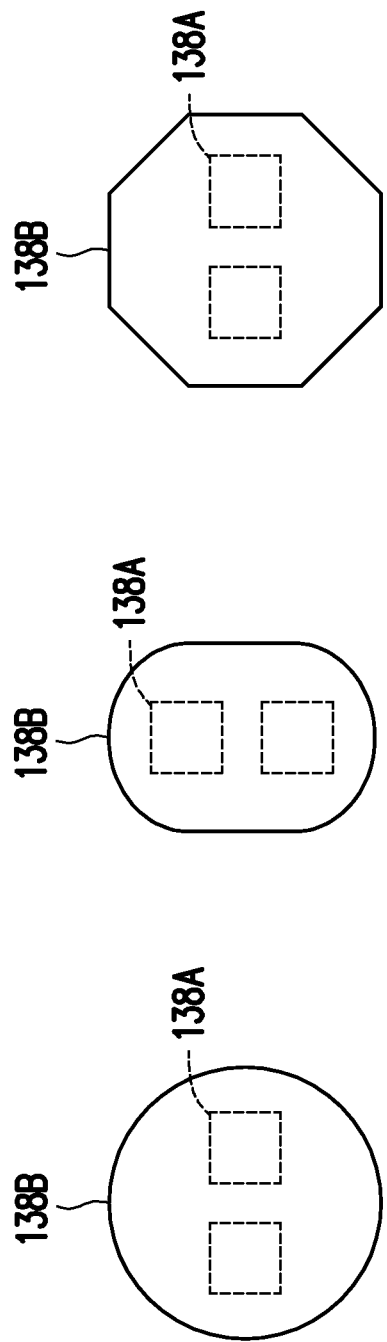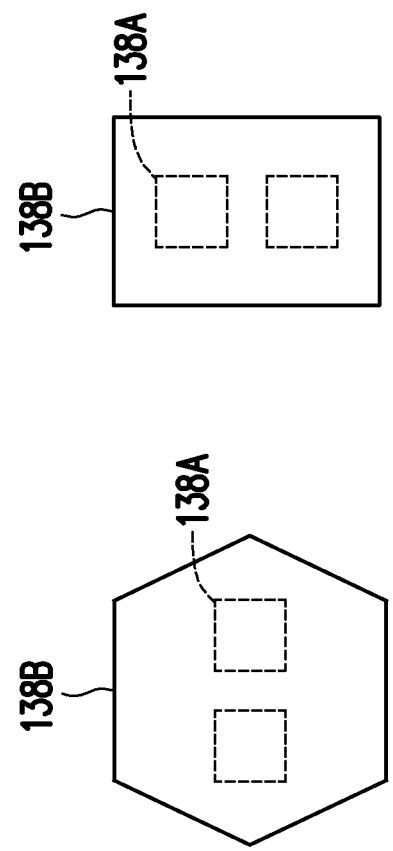

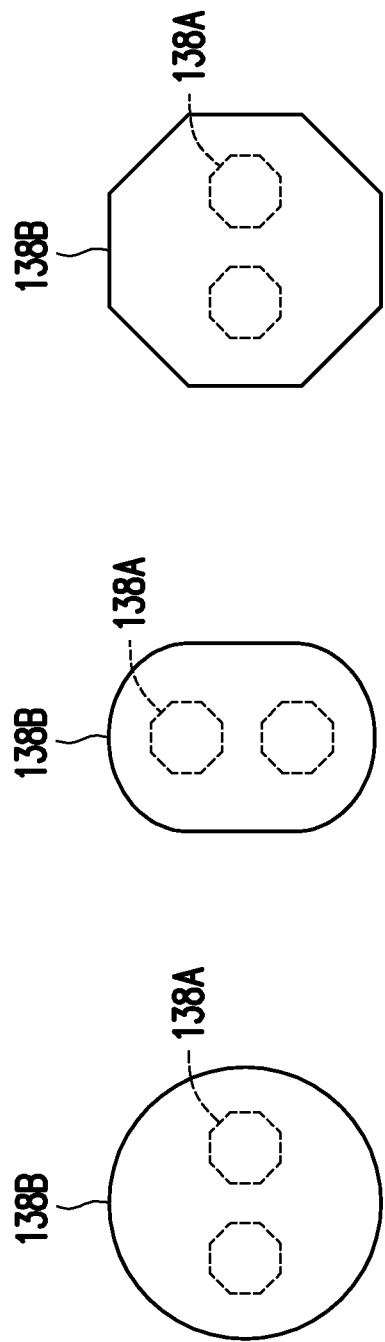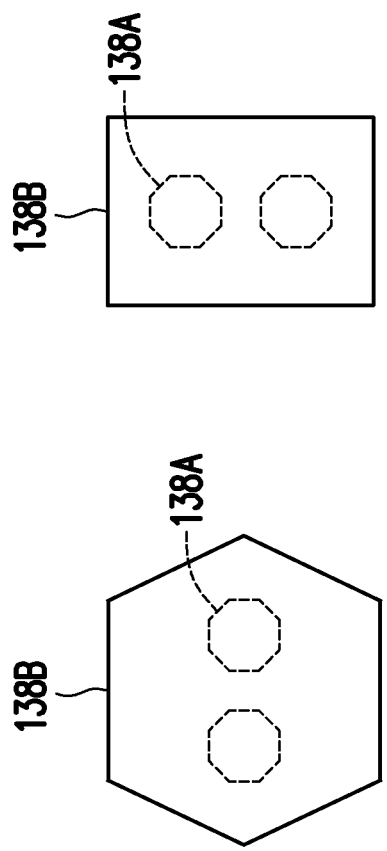

INTEGRATED CIRCUIT PACKAGE AND METHOD

PRIORITY CLAIM AND CROSS-REFERENCE

This application claims the benefit of U.S. Provisional Application No. 62/773,455, filed on Nov. 30, 2018, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 20 illustrate cross-sectional views of intermediate steps during a process for forming a package component, in accordance with some embodiments.

DETAILED DESCRIPTION

Figure 1:
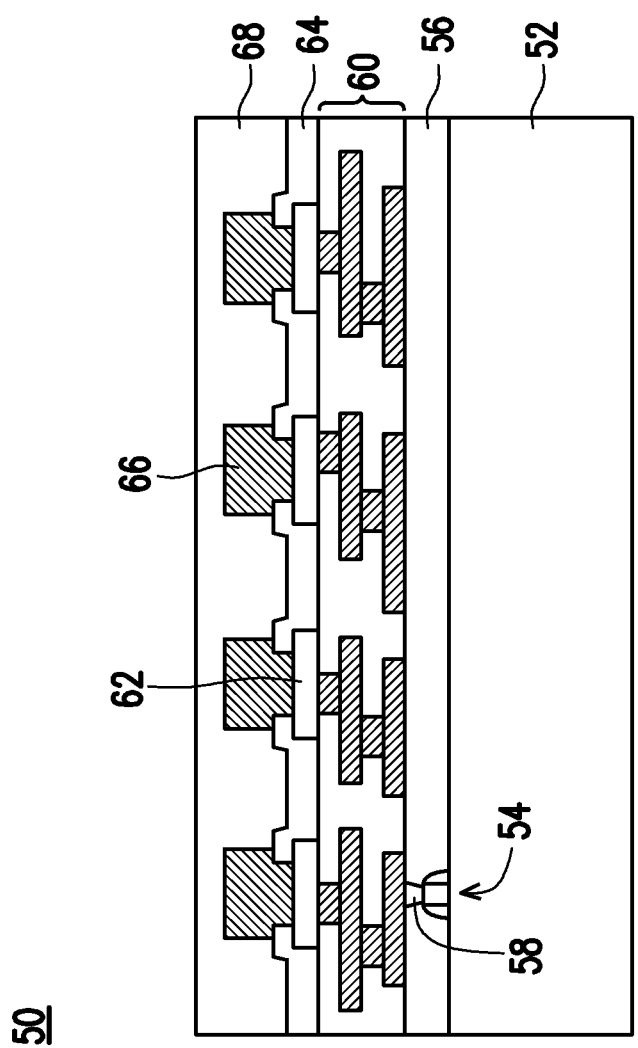
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, under-bump metallurgies (UBMs) are formed for a redistribution structure and external connectors are formed physically and electrically coupling the UBMs. The UBMs have via portions extending through a topmost dielectric layer of the redistribution structure, and bump portions on which the external connectors are formed. The via portions have a small width and a large height-to-width ratio. Further, the topmost dielectric layer has a large thickness. Forming the UBMs with a large height-to-width ratio allows the UBMs and topmost dielectric layer of the redistribution structure to buffer mechanical stresses, thereby increasing reliability of the redistribution structure during testing or operation.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 20 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
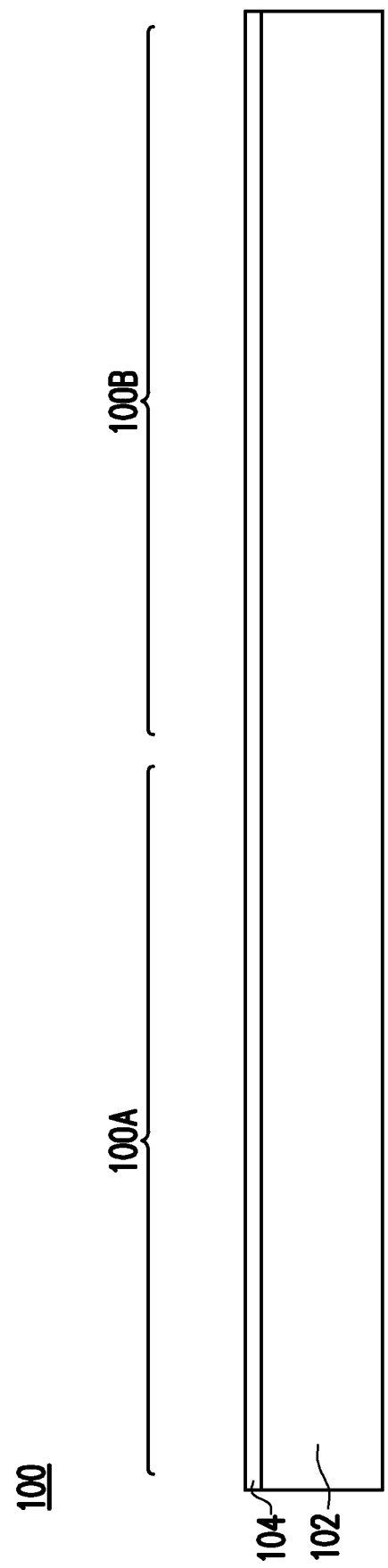

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
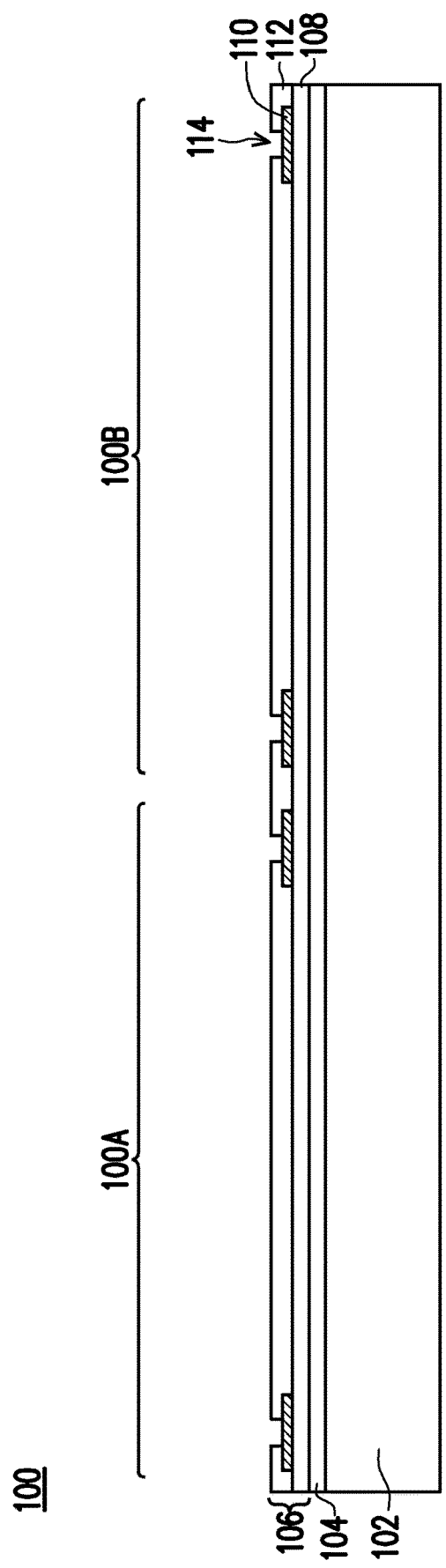

In FIG. 3, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 4:
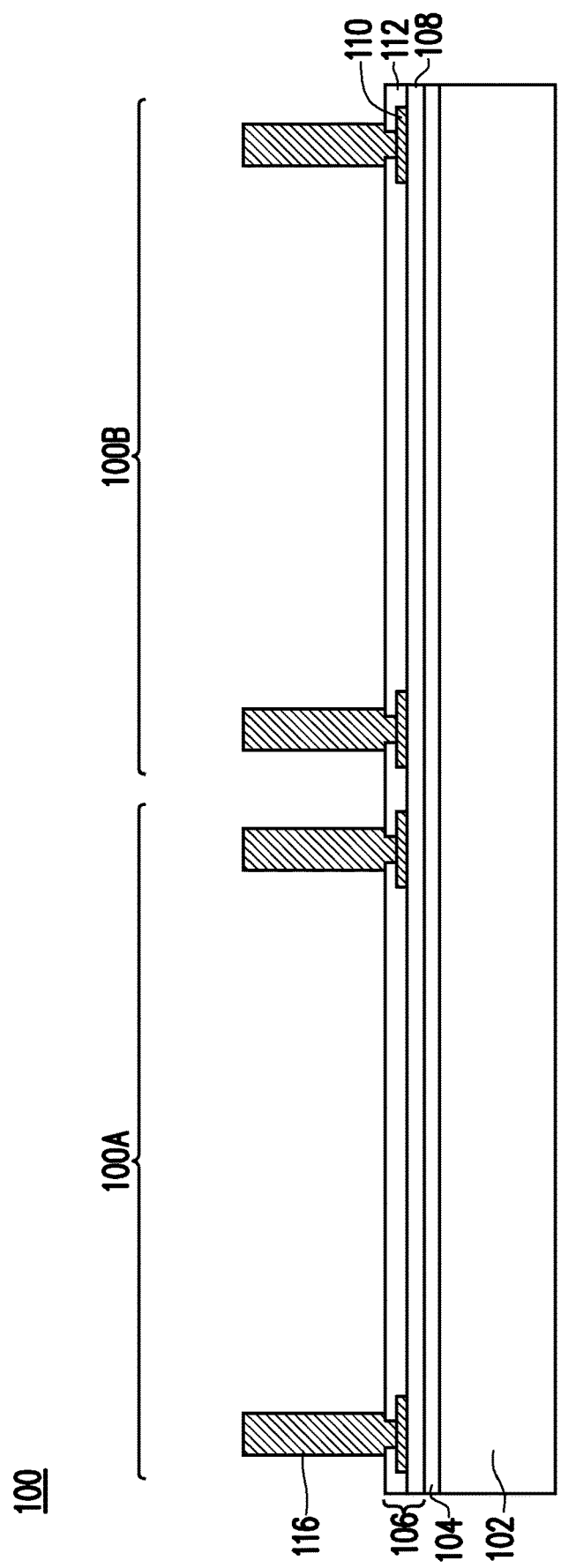

In FIG. 4, through vias 116 may be formed in the openings 114 and extending away from the topmost dielectric layer of the back-side redistribution structure 106 (e.g., the dielectric layer 112). The through vias 116 are optional, and may be omitted. For example, the through vias 116 may (or may not) be omitted in embodiments where the back-side redistribution structure 106 is omitted. As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
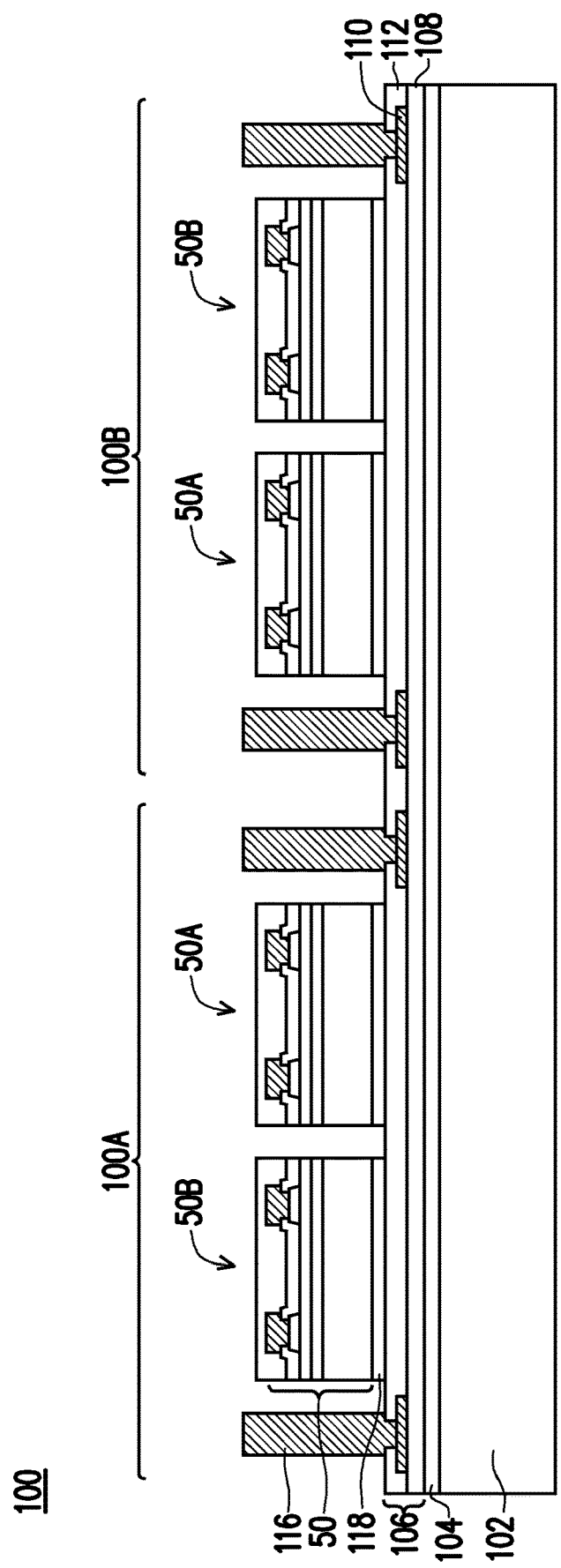

In FIG. 5, integrated circuit dies 50 are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including a first integrated circuit die 50A and a second integrated circuit die 50B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the package regions 100A and 100B may be limited, particularly when the integrated circuit dies 50A and 50B include devices with a large footprint, such as SoCs. Use of the back-side redistribution structure 106 allows for an improved interconnect arrangement when the package regions 100A and 100B have limited space available for the through vias 116.

The adhesive 118 is on back-sides of the integrated circuit dies 50A and 50B and adheres the integrated circuit dies 50A and 50B to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50A and 50B or may be applied over the surface of the carrier substrate 102. For example, the adhesive 118 may be applied to the back-sides of the integrated circuit dies 50A and 50B before singulating to separate the integrated circuit dies 50A and 50B.

Figure 6:
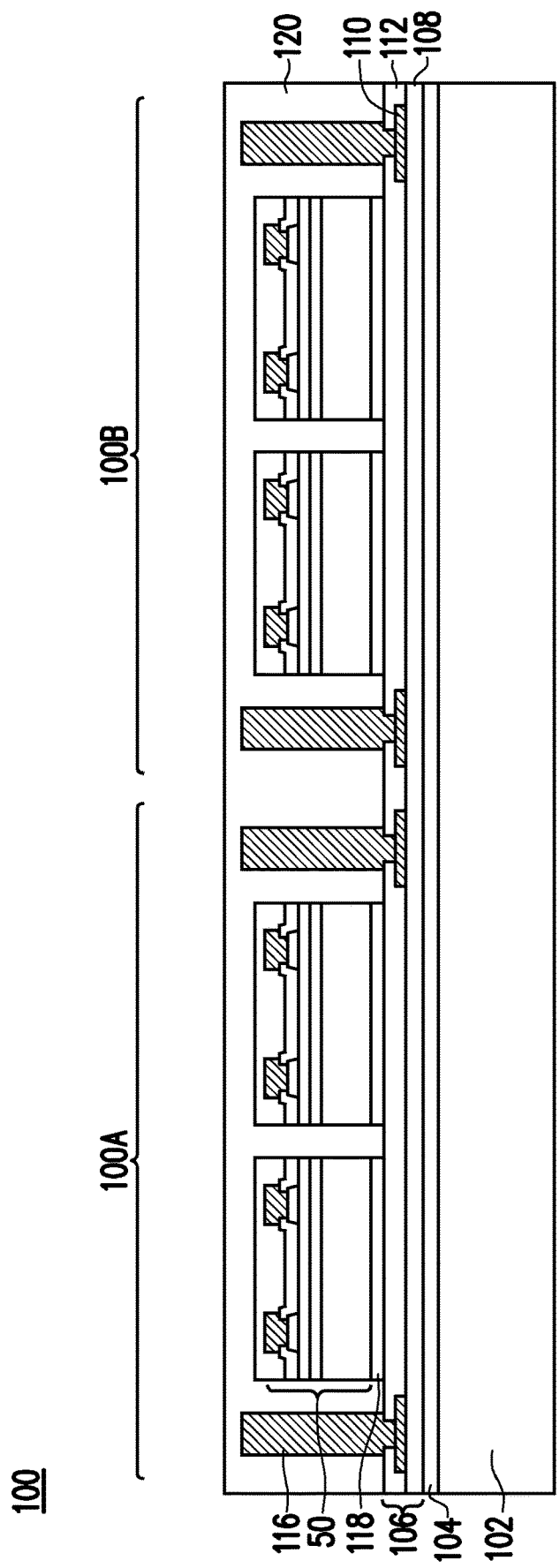

In FIG. 6, an encapsulant 120 is formed on and around the various components. After formation, the encapsulant 120 encapsulates the through vias 116 and integrated circuit dies 50A and 50B. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50A and 50B are buried or covered. The encapsulant 120 is further formed in gap regions between the integrated circuit dies 50A and 50B, if present. The encapsulant 120 may be applied in liquid or semi-liquid form and then subsequently cured.

Figure 7:
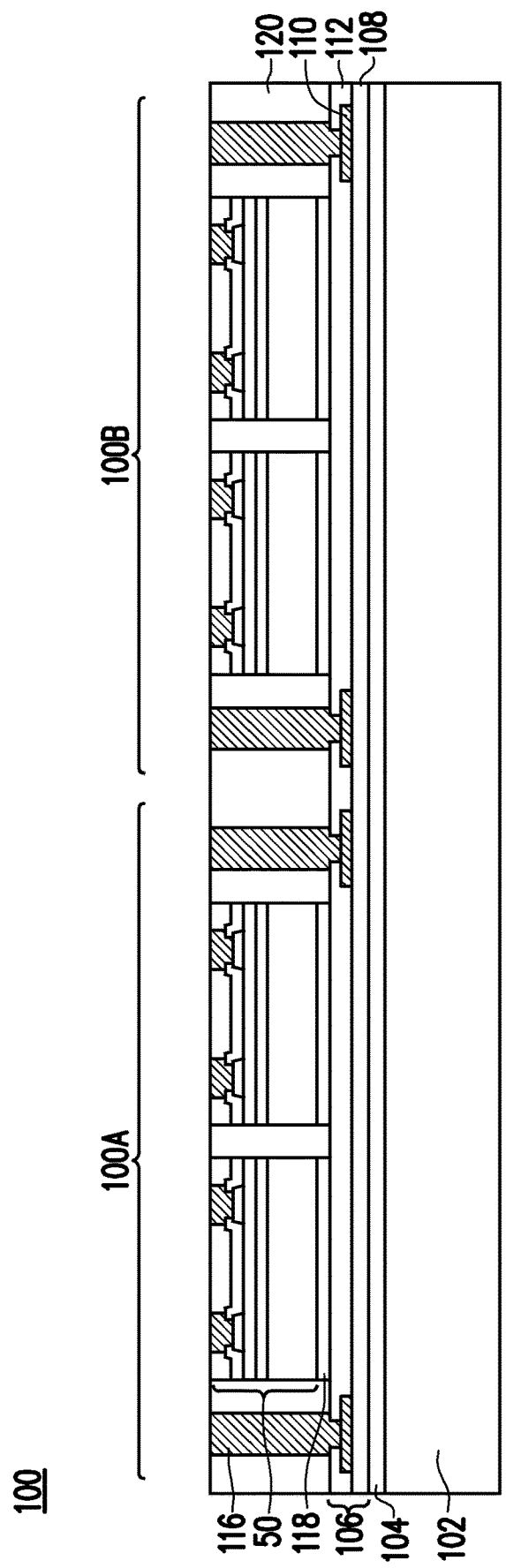

In FIG. 7, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are coplanar after the planarization process. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 8 through 11, a front-side redistribution structure 122 (see FIG. 11) is formed over the encapsulant 120, through vias 116, and integrated circuit dies 50A and 50B. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 8:
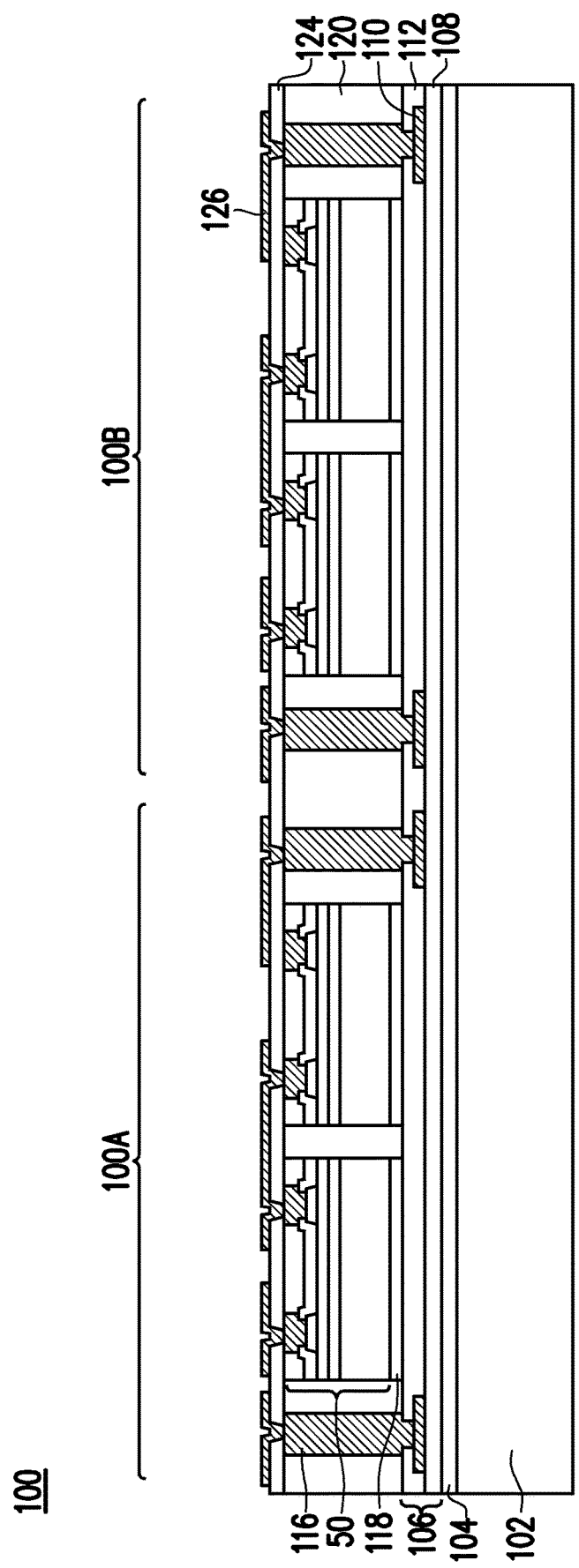

In FIG. 8, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The metallization pattern 126 is then formed. The metallization pattern 126 includes line portions (also referred to as conductive lines) on and extending along the major surface of the dielectric layer 124. The metallization pattern 126 further includes via portions (also referred to as conductive vias) extending through the dielectric layer 124 to physically and electrically couple the through vias 116 and the integrated circuit dies 50A and 50B. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 9:
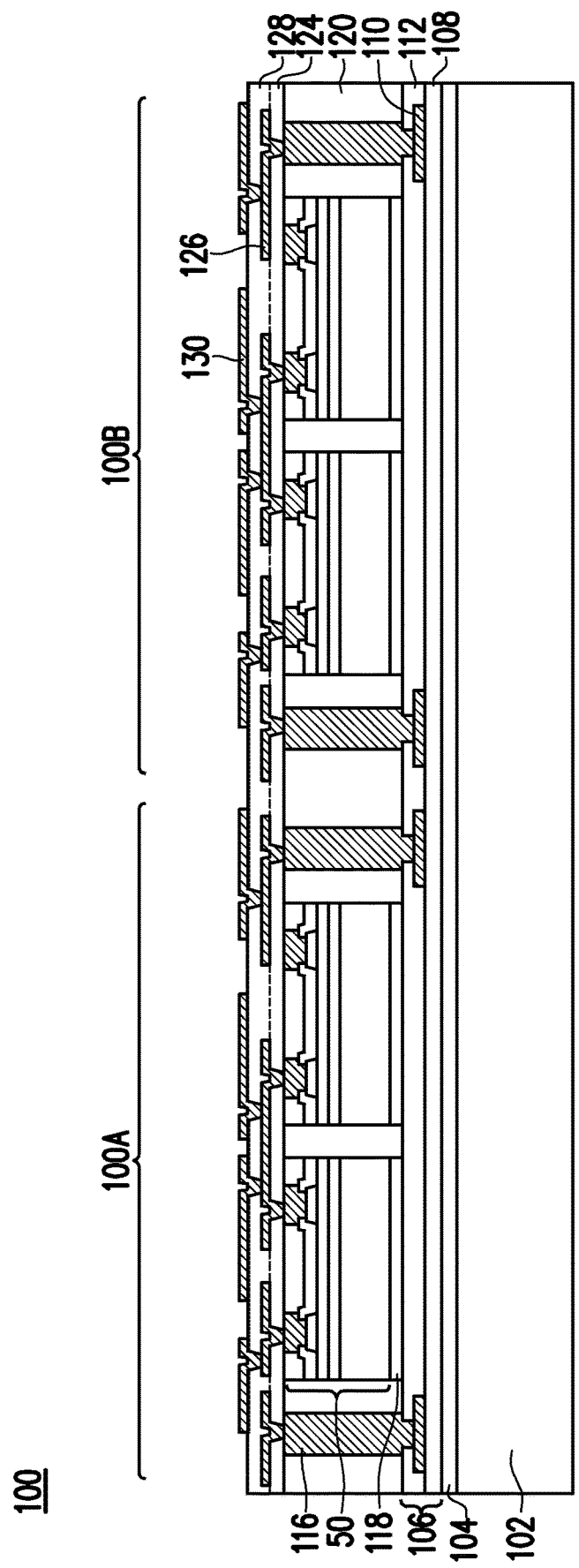

In FIG. 9, the dielectric layer 128 is deposited on the metallization pattern 126 and dielectric layer 124. The dielectric layer 128 may be formed in a manner similar to the dielectric layer 124, and may be formed of a similar material as the dielectric layer 124.

The metallization pattern 130 is then formed. The metallization pattern 130 includes line portions on and extending along the major surface of the dielectric layer 128. The metallization pattern 130 further includes via portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 10:
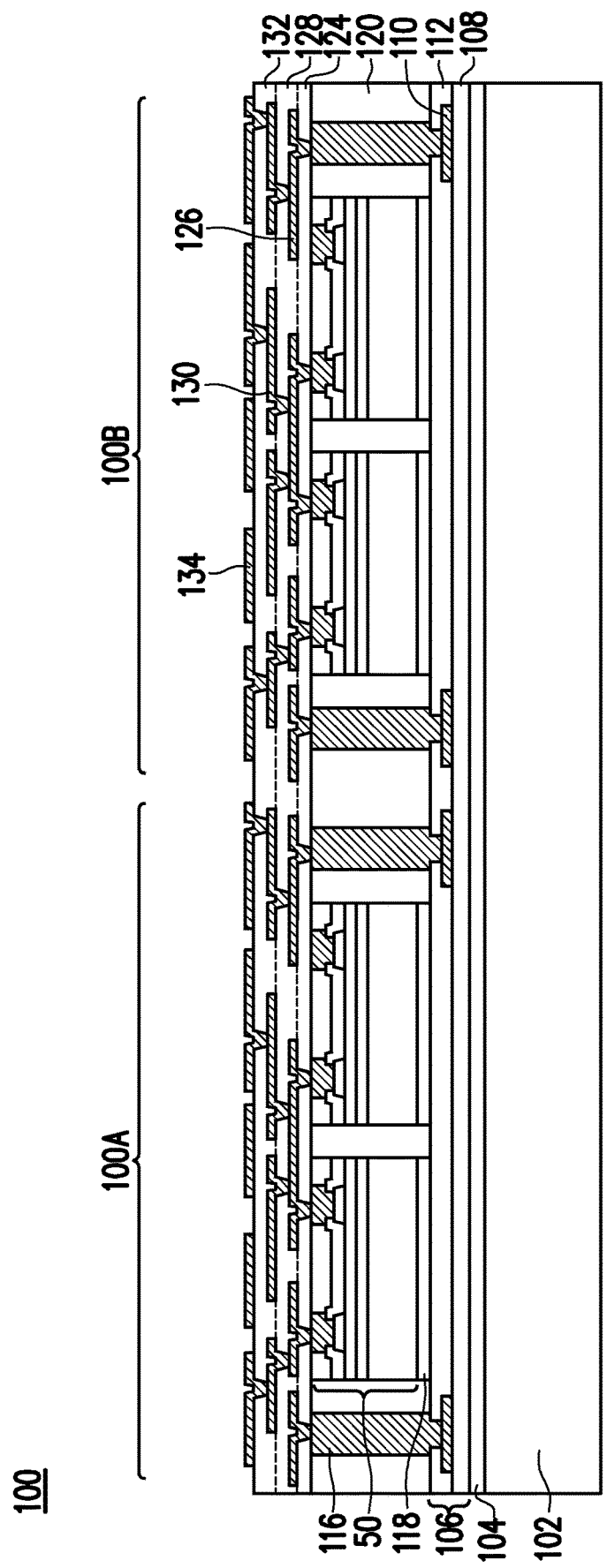

In FIG. 10, the dielectric layer 132 is deposited on the metallization pattern 130 and dielectric layer 128. The dielectric layer 132 may be formed in a manner similar to the dielectric layer 124, and may be formed of a similar material as the dielectric layer 124.

The metallization pattern 134 is then formed. The metallization pattern 134 includes line portions on and extending along the major surface of the dielectric layer 132. The metallization pattern 134 further includes via portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50A and 50B. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 11:
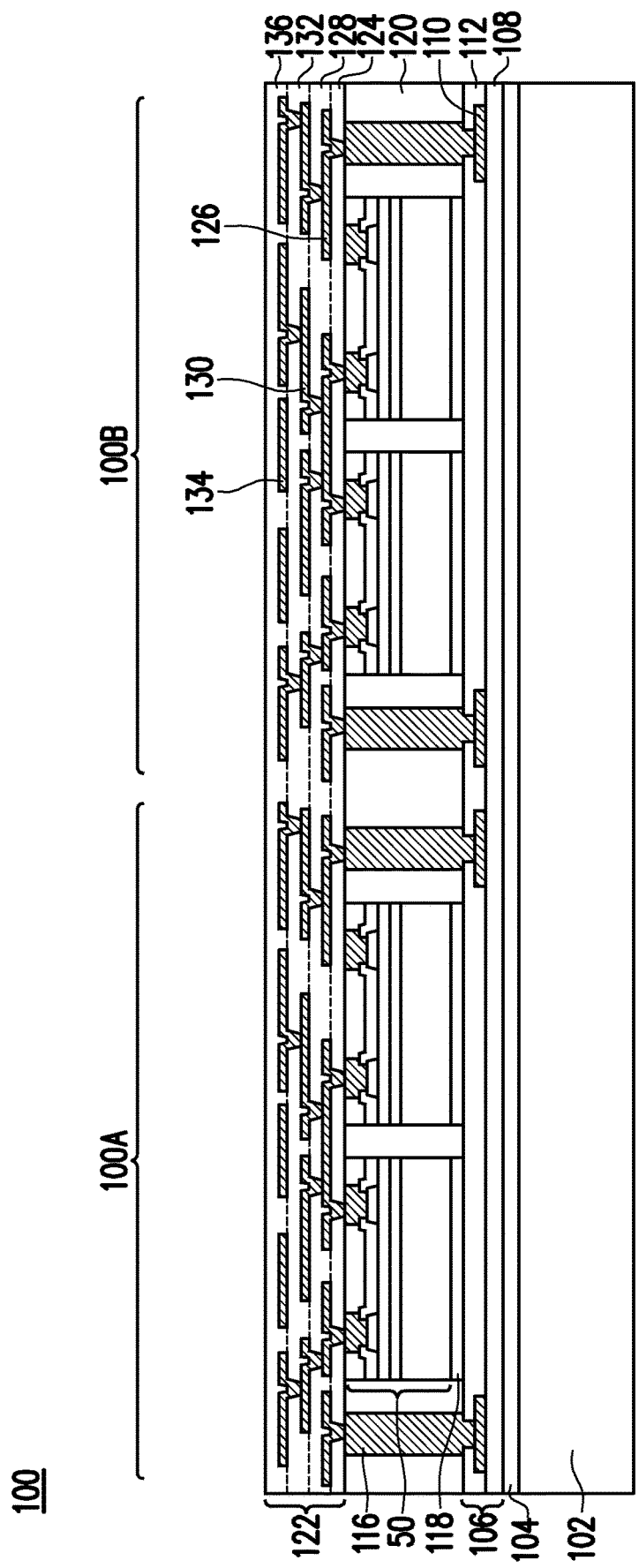

In FIG. 11, the dielectric layer 136 is deposited on the metallization pattern 134 and dielectric layer 132. The dielectric layer 136 may be formed in a manner similar to the dielectric layer 124, and may be formed of a similar material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50A and 50B. Further, all of the intermediate dielectric layers of the front-side redistribution structure 122 (e.g., the dielectric layers 124, 128, 132) are disposed between the dielectric layer 136 and the integrated circuit dies 50A and 50B.

Figure 12:
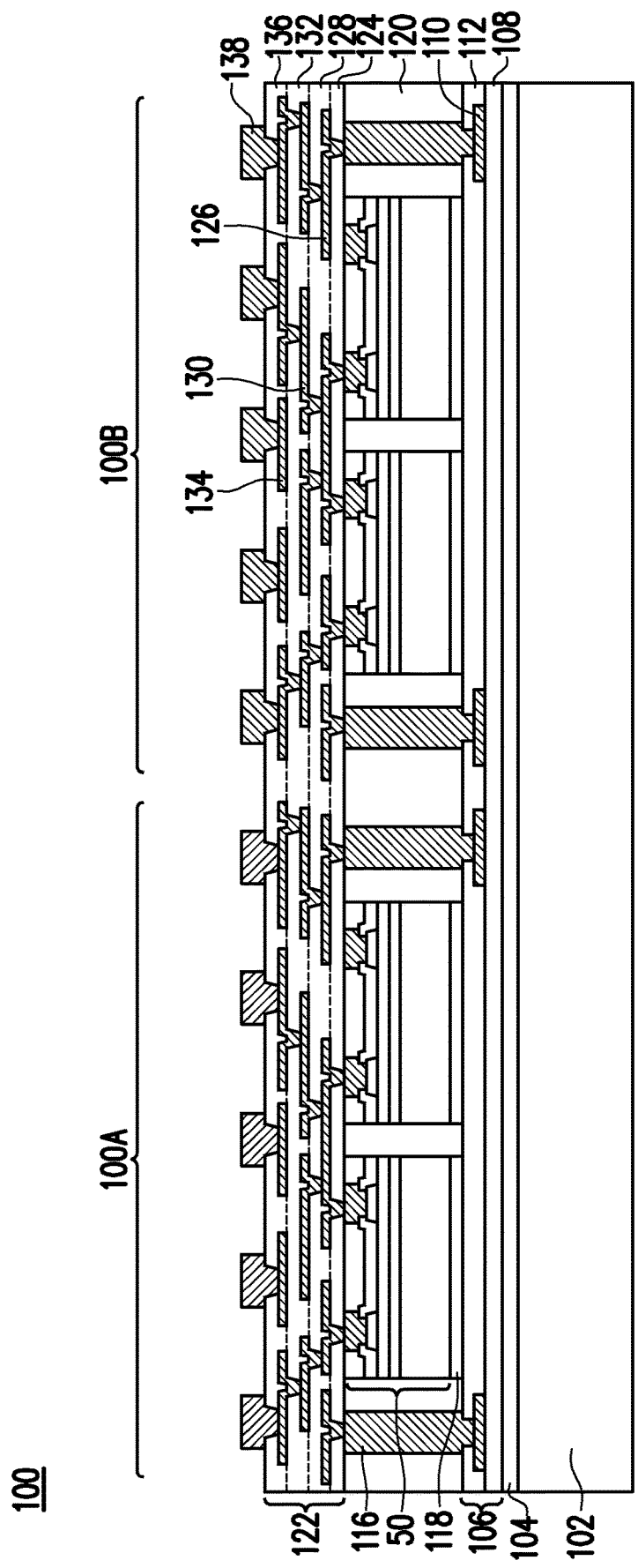

In FIG. 12, UBMs 138 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50A and 50B. The UBMs 138 may be formed in one of several processes, or a combination of several processes.

Figure 13A:
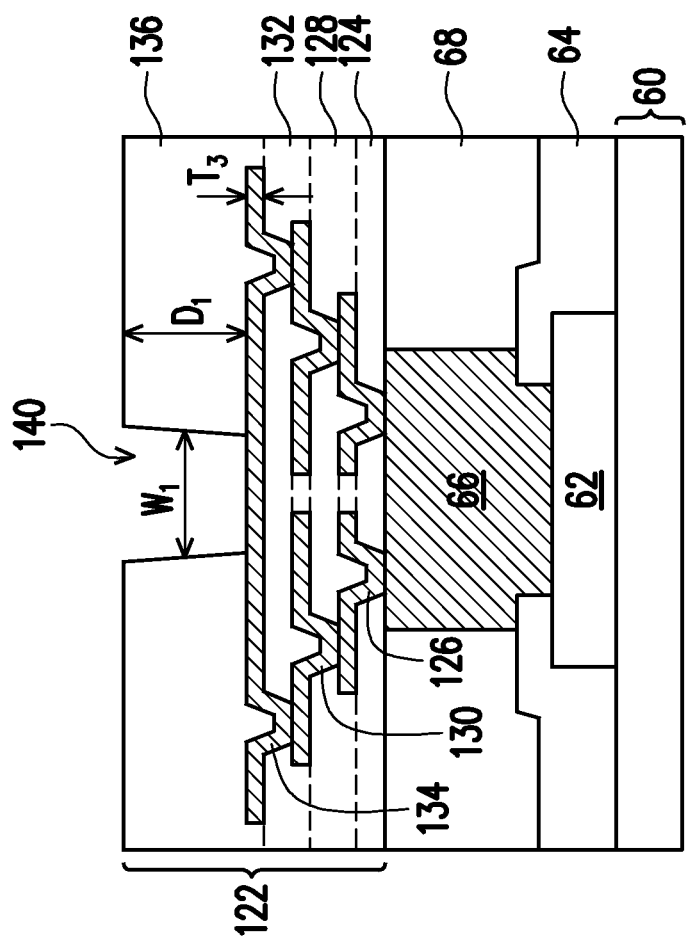
Figure 13B:
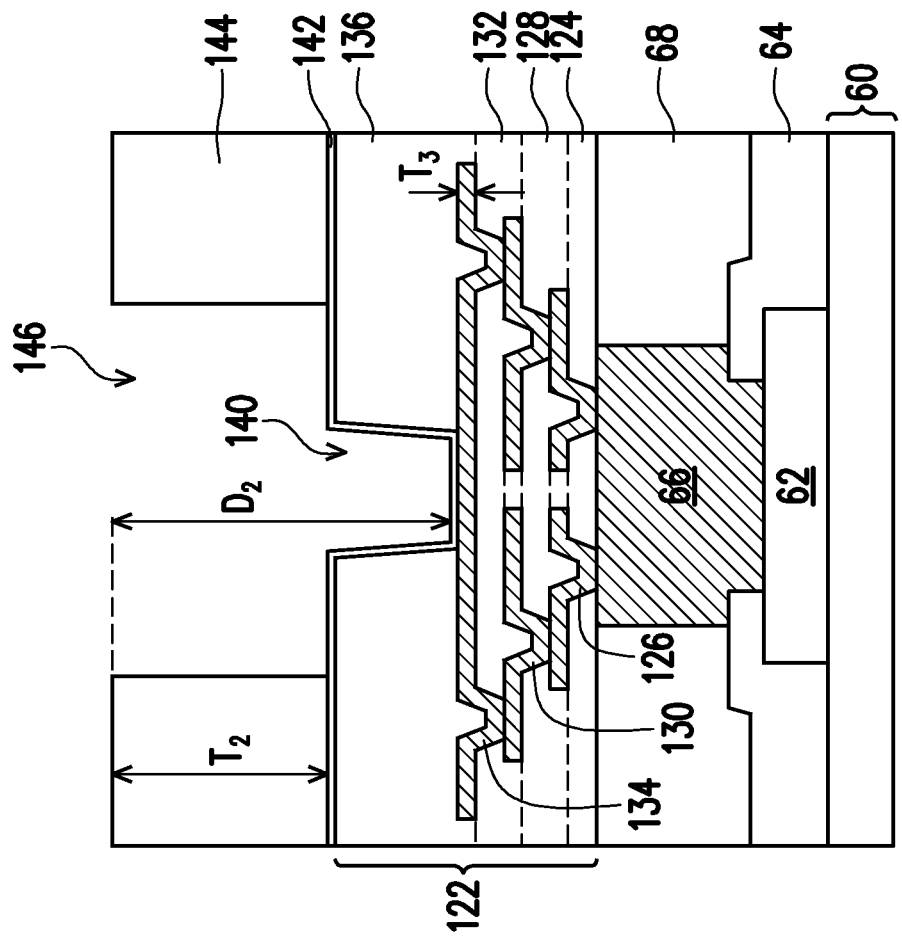
Figure 13C:
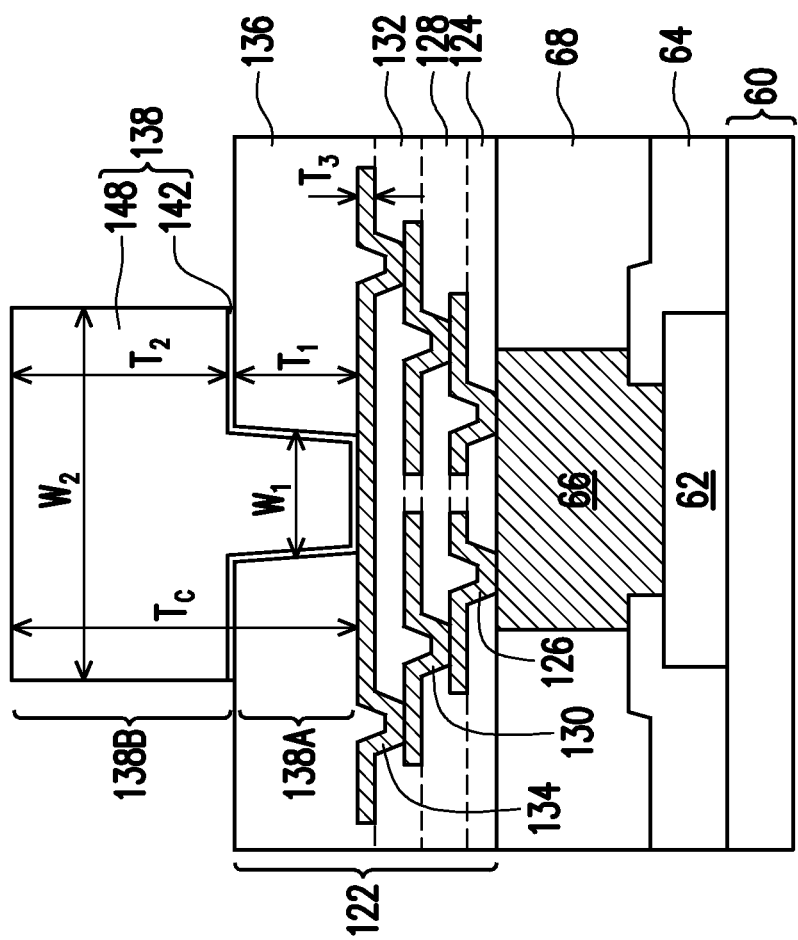

FIGS. 13A through 13C illustrate a method of forming the UBMs 138, in accordance with some embodiments. The formation of a single UBM 138 is illustrated in a detailed view of a region of the first package component 100. It should be appreciated that some details are omitted or exaggerated for clarity of illustration. Further, multiple UBMs 138 may be simultaneously formed.

In FIG. 13A, the dielectric layer 136 is patterned to form openings 140 exposing portions of the metallization pattern 134. The patterning may be by an acceptable process, such as by exposing the dielectric layer 136 to light when the dielectric layer 136 is a photo-sensitive material or by etching using, for example, an anisotropic etch. If the dielectric layer 136 is a photo-sensitive material, the dielectric layer 136 can be developed after the exposure. The openings 140 have a small average width $W_1$. In some embodiments, the width $W_1$ in the range of about 20 µm to about 25 µm, such as about 25 µm. The small width $W_1$ of the openings 140 reduces the amount of the metallization pattern 134 contacted by the UBMs 138. In other words, the UBMs 138 contact smaller landing pads of the metallization pattern 134. The amount of the metallization pattern 134 available for signal routing may thus be increased.

The dielectric layer 136 has a large thickness, and thus the openings 140 have a large depth $D_1$. The depth $D_1$ is greater than the thicknesses of the intermediate dielectric layers of the front-side redistribution structure 122. In some embodiments, the depth $D_1$ is at least about 7 µm, such as in the range of about 10 µm to about 30 µm, such as about 15 µm. The large thickness of the dielectric layer 136 may help reduce the mechanical stress exerted on the metallization patterns 126, 130, and 134 when the front-side redistribution structure 122 is attached to another substrate (discussed further below). In particular, because the dielectric layer 136 is the topmost dielectric layer of the front-side redistribution structure 122, the large thickness allows the dielectric layer 136 to buffer mechanical stresses that may otherwise be exerted on the intermediate dielectric layers of the front-side redistribution structure 122. Cracking and delamination in the front-side redistribution structure 122 may thus be avoided. In an experiment, a depth $D_1$ of about 15 µm decreased mechanical strain between the dielectric layer 136 and metallization pattern 134 by about 23%, with no further cracks developing during post-processing and stress testing.

In FIG. 13B, a seed layer 142 is formed over the dielectric layer 136 and in the openings 140. In some embodiments, the seed layer 142 is a metal layer, which may be a single layer or a composite layer comprising a plurality of sub-layers formed of different materials. In some embodiments, the seed layer 142 comprises a titanium layer and a copper layer over the titanium layer. The seed layer 142 may be formed using, for example, PVD or the like. A photoresist 144 is then formed and patterned on the seed layer 142. The photoresist 144 may be formed by spin coating or the like. In some embodiments, the photoresist 144 is formed to a thickness $T_2$ in the range of about 10 µm to about 100 µm, such as about 72 µm. The photoresist 144 may then be exposed to light for patterning. The pattern of the photoresist 144 corresponds to the UBMs 138. The patterning forms openings 146 through the photoresist 144 to expose the seed layer 142. After formation, the openings 140 and 146 have a combined depth $D_2$. In some embodiments, the depth $D_2$ is in the range of about 5 µm to about 90 µm, such as about 35 µm.

In FIG. 13C, a conductive material 148 is formed in the openings 146 of the photoresist 144 and on the exposed portions of the seed layer 142. The conductive material 148 may be formed by plating, such as electroplating or electroless plating, or the like. The conductive material 148 may comprise a metal, like copper, titanium, tungsten, aluminum, or the like. Then, the photoresist 144 and portions of the seed layer 142 on which the conductive material 148 is not formed are removed. The photoresist 144 may be removed by an acceptable ashing or stripping process, such as using an oxygen plasma or the like. Once the photoresist 144 is removed, exposed portions of the seed layer 142 are removed, such as by using an acceptable etching process, such as by wet or dry etching. The remaining portions of the seed layer 142 and conductive material 148 form the UBMs 138. In embodiments where the UBMs 138 are formed differently, more photoresist 144 and patterning steps may be utilized.

After formation, the via portions 138A of the UBMs 138 have a thickness $T_1$ that is equal to the depth $D_1$ of the openings 140. The ratio of the thickness $T_1$ to the width $W_1$ may be referred to as the aspect ratio of the via portions 138A of the UBMs 138. In some embodiments, the aspect ratio of the openings 140 is in the range of about 1.33 to about 1.66. In an experiment, an aspect ratio in the range of about 1.33 to about 1.66 decreased the mechanical stress exerted on the metallization pattern 134 by about 14%. Further, in some embodiments, the metallization pattern 134 has a thickness $T_3$ in the range of about 0.8 µm to about 4 µm. In some embodiments, the ratio of the thickness $T_1$ to the thickness $T_3$ is in the range of about 3.5 to about 10, such as at least 6.

Further, after formation, the bump portions 138B of the UBMs 138 have a thickness $T_2$ that is greater than the thickness $T_1$. In some embodiments, the thickness $T_2$ is in the range of about 10 µm to about 40 µm, such as about 30 µm. Such a thickness $T_2$ may also help reduce mechanical stress exerted on the metallization pattern 134. In an experiment, a thickness $T_2$ of about 30 µm decreased the mechanical stress exerted on the metallization pattern 134 by about 10%. The ratio of the thickness $T_2$ to the thickness $T_1$ is large. In some embodiments, the ratio of the thickness $T_2$ to the thickness $T_1$ is at least 1.5, such as in the range of about 1.5 to about 2.33.

Further, after formation, the via portions 138A of the UBMs 138 have the same width $W_1$ as the openings 140. The bump portions 138B of the UBMs 138 have a small average width $W_2$. In some embodiments, the width $W_2$ is at least 50 µm, such as in the range of about 70 µm to about 105 µm. In an experiment, a width $W_2$ of about 82 µm decreased the mechanical stress exerted on the metallization pattern 134 by about 10%. The width $W_2$ is greater than the width $W_1$. A small average width $W_2$ allows the distance between adjacent UBMs 138 to be increased. The risk of solder bridging between UBMs 138 by subsequently formed conductive connectors may thus be reduced. The ratio of the width $W_2$ to the width $W_1$ is large. In some embodiments, the ratio of the width $W_2$ to the width $W_1$ is at least 2.5, such as in the range of about 2.5 to about 3.6. Further, after formation, the UBMs 138 have a combined thickness $T_C$, which is the sum of the thicknesses $T_1$ and $T_2$. In some embodiments, the combined thickness $T_C$ is in the range of about 20 µm to about 70 µm. The ratio of the combined thickness $T_C$ to the width $W_1$ is large. In some embodiments, the ratio of the combined thickness $T_C$ to the width $W_1$ is at least 0.2, such as in the range of about 0.2 to about 3.3. In an experiment, a combined thickness $T_C$ of about 50 µm in combination with a width $W_1$ of about 15 µm decreased the mechanical stress exerted on the metallization pattern 134 by about 15%.

As noted above, the various values and ratios of the UBMs 138 allows the mechanical reliability of the front-side redistribution structure 122 to be increased. In an experiment, the combination of the aspect ratio of the openings 140 being in the range of about 1.33 to about 1.66, the ratio of the thickness $T_1$ to the thickness $T_3$ being in the range of about 3.5 to about 10, and the ratio of the thickness $T_2$ to the thickness $T_1$ being in the range of about 1.5 to about 2.33 allowed the UBMs 138 to undergo thermal stress testing over 2000 times without component failure.

Figure 14:
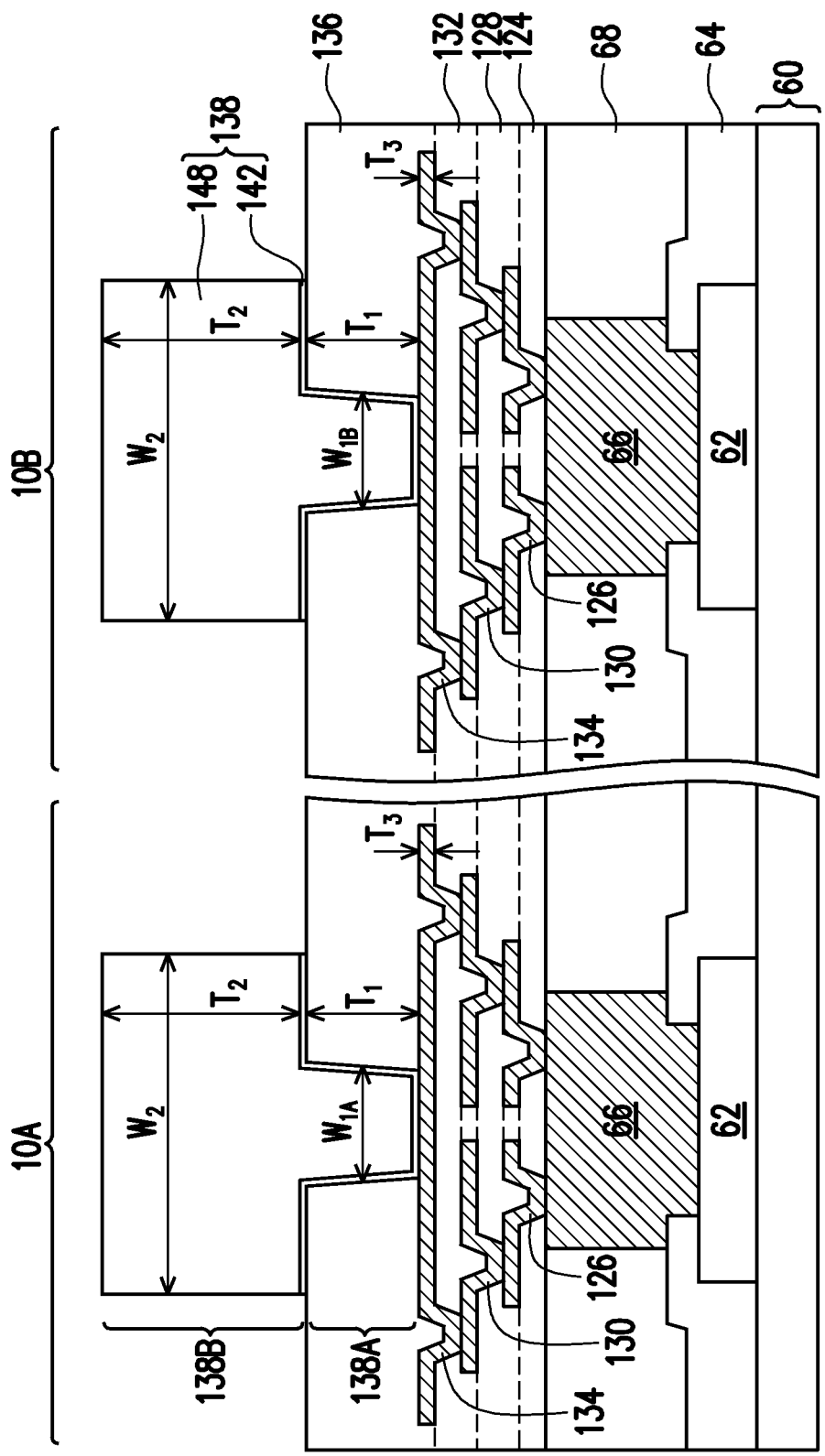

FIG. 14 illustrates the UBMs 138, in accordance with some other embodiments. Multiple UBMs 138 are illustrated in a detailed view of a first region 10A and a second region 10B of the first package component 100. It should be appreciated that some details are omitted or exaggerated for clarity of illustration. In this embodiment, the bump portions 138B of the UBMs 138 have a same width $W_2$ and thickness $T_2$ in both of the regions 10A and 10B. Further, the via portions 138A of the UBMs 138 have a same thickness $T_1$ in both of the regions 10A and 10B. However, the via portions 138A of the UBMs 138 have different widths in the regions 10A and 10B. For example, the via portions 138A of the UBMs 138 in the first region 10A have a first width $W_{1A}$, and the via portions 138A of the UBMs 138 in the second region 10B have a second width $W_{1B}$. The widths $W_{1A}$ and $W_{1B}$ differ by a large amount. In some embodiments, the difference between the widths $W_{1A}$ and $W_{1B}$ is at least 5 µm, such as in the range of about 25 µm to about 45 µm. The via portions of narrower widths are formed in regions under higher mechanical stress. For example, when the first region 10A is under higher mechanical stress than the second region 10B, the width $W_{1A}$ is smaller than the width $W_{1B}$.

Figure 15:
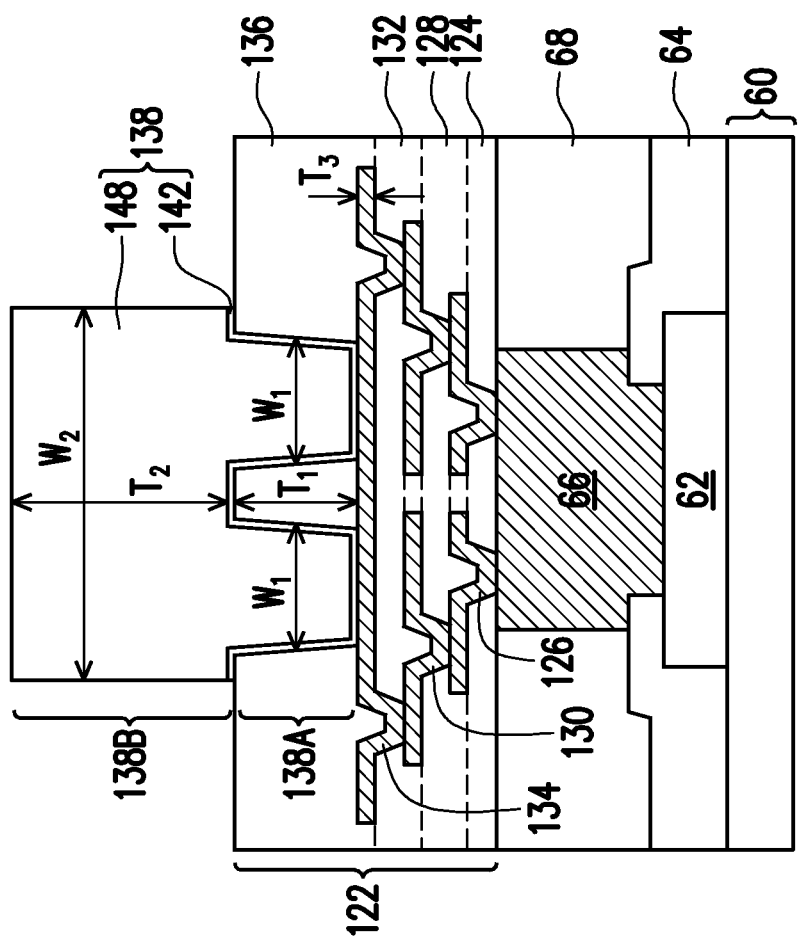

FIG. 15 illustrates a UBM 138, in accordance with some other embodiments. A single UBM 138 is illustrated in a detailed view of a region of the first package component 100. It should be appreciated that some details are omitted or exaggerated for clarity of illustration. Further, multiple UBMs 138 may be simultaneously formed. In this embodiment, the UBMs 138 have multiple via portions 138A, each having a same width $W_1$. Each of the via portions 138A for a given UBM 138 contact a same landing pad of the metallization pattern 134. The UBMs 138 may have any quantity of via portions 138A, such as a quantity in the range of 2 to 4. The additional via portions 138A may help buffer mechanical stresses that may otherwise be exerted on the intermediate metallization patterns of the front-side redistribution structure 122. Cracking and delamination in the front-side redistribution structure 122 may thus be avoided.

Figure 16:
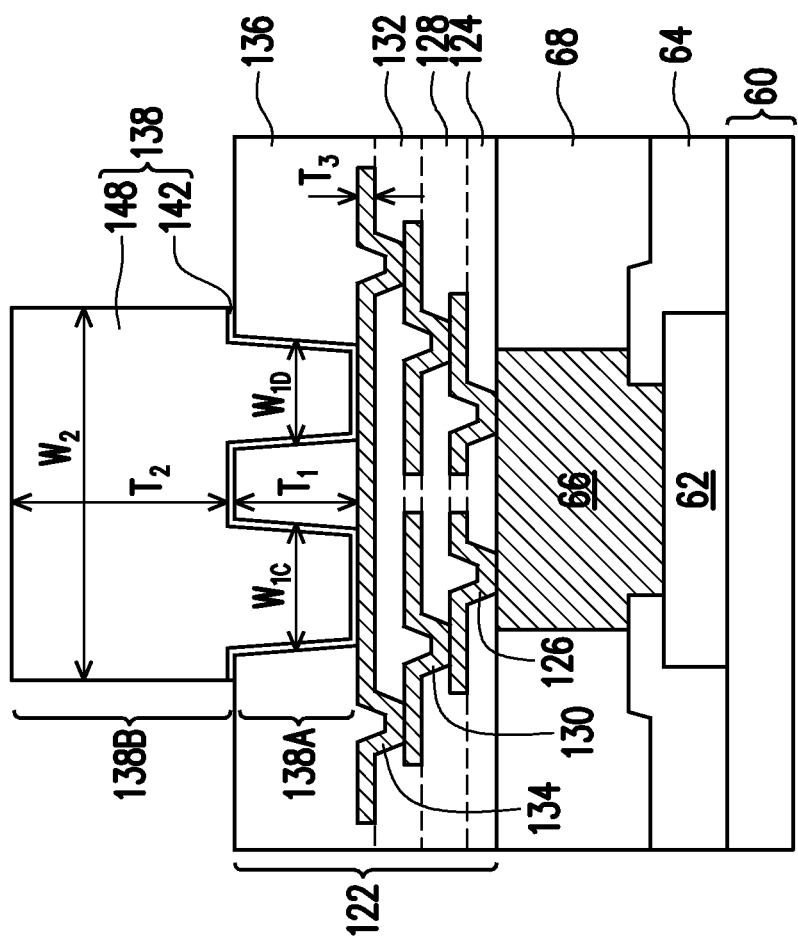

FIG. 16 illustrates a UBM 138, in accordance with some other embodiments. A single UBM 138 is illustrated in a detailed view of a region of the first package component 100. It should be appreciated that some details are omitted or exaggerated for clarity of illustration. Further, multiple UBMs 138 may be simultaneously formed. In this embodiment, the UBMs 138 have multiple via portions 138A, each having a different width. For example, the UBMs 138 may have a first via portion with a first width $W_{1C}$ and a second via portion with a second width $W_{1D}$. The widths $W_{1C}$ and $W_{1D}$ may differ. In some embodiments, the difference between the widths $W_{1C}$ and $W_{1D}$ is at least 5 µm, such as in the range of about 25 µm to about 45 µm.

FIGS. 17A through 17O are top-down views of the UBMs 138, in accordance with the embodiments of FIG. 15 and FIG. 16. The via portions 138A and bump portions 138B of the UBMs 138 may have several possible shapes in the top-down view. Further, the via portions 138A and bump portions 138B of the UBMs 138 may have the same shape in the top-down view, or may have different shapes in the top-down view. The via portions 138A may have circular shapes (see FIGS. 17A through 17E), quadrilateral/square shapes (see FIGS. 17F through 17J), and/or octagonal shapes (see FIGS. 17K through 17O). A single UBM 138 may include multiple via portions 138A of different shapes. Likewise, the bump portions 138B may have circular shapes (see FIGS. 17A, 17F, and 17K), oval shapes (see FIGS. 17B, 17G, and 17L), octagonal shapes (see FIGS. 17C, 17H, and 17M), hexagonal shapes (see FIGS. 17D, 17I, and 17N), and/or quadrilateral/square shapes (see FIGS. 17E, 17J, and 17O). Further, UBMs 138 having bump portions 138B of different shapes may be combined on a same package.

Figure 18:
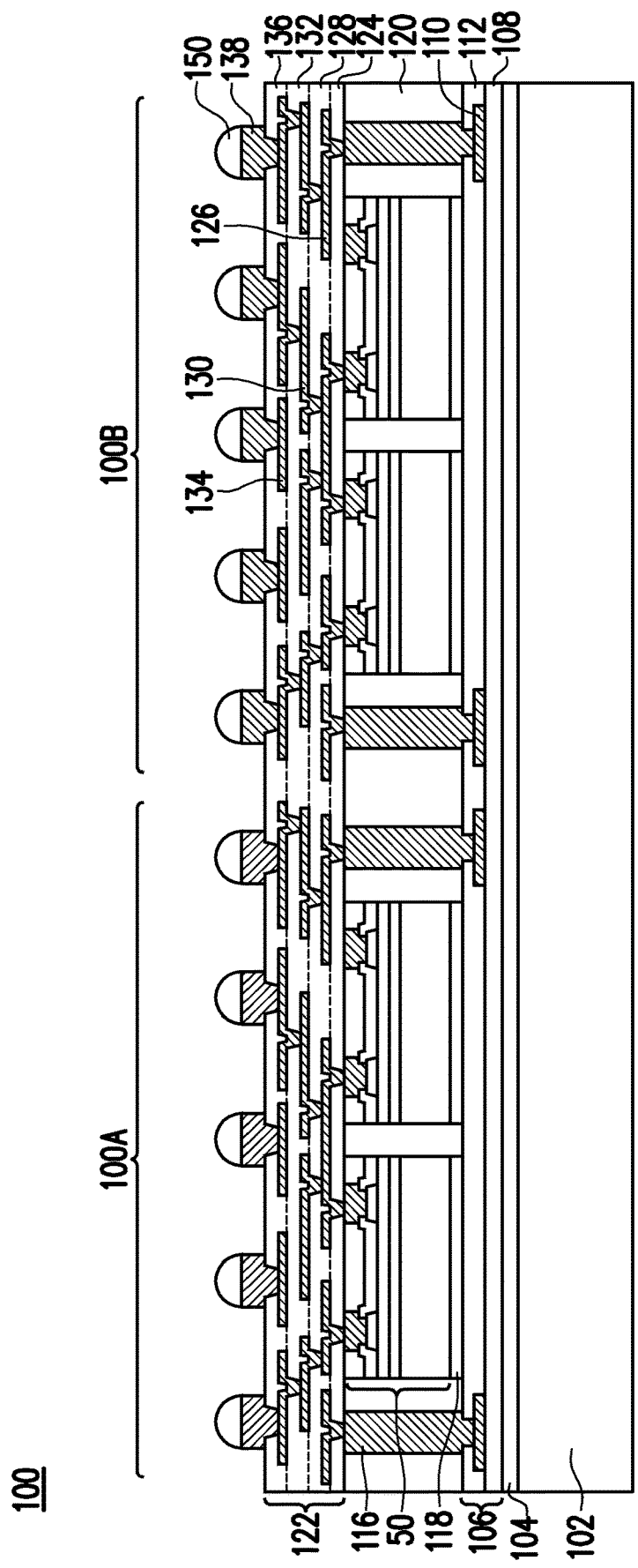

In FIG. 18, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 19:
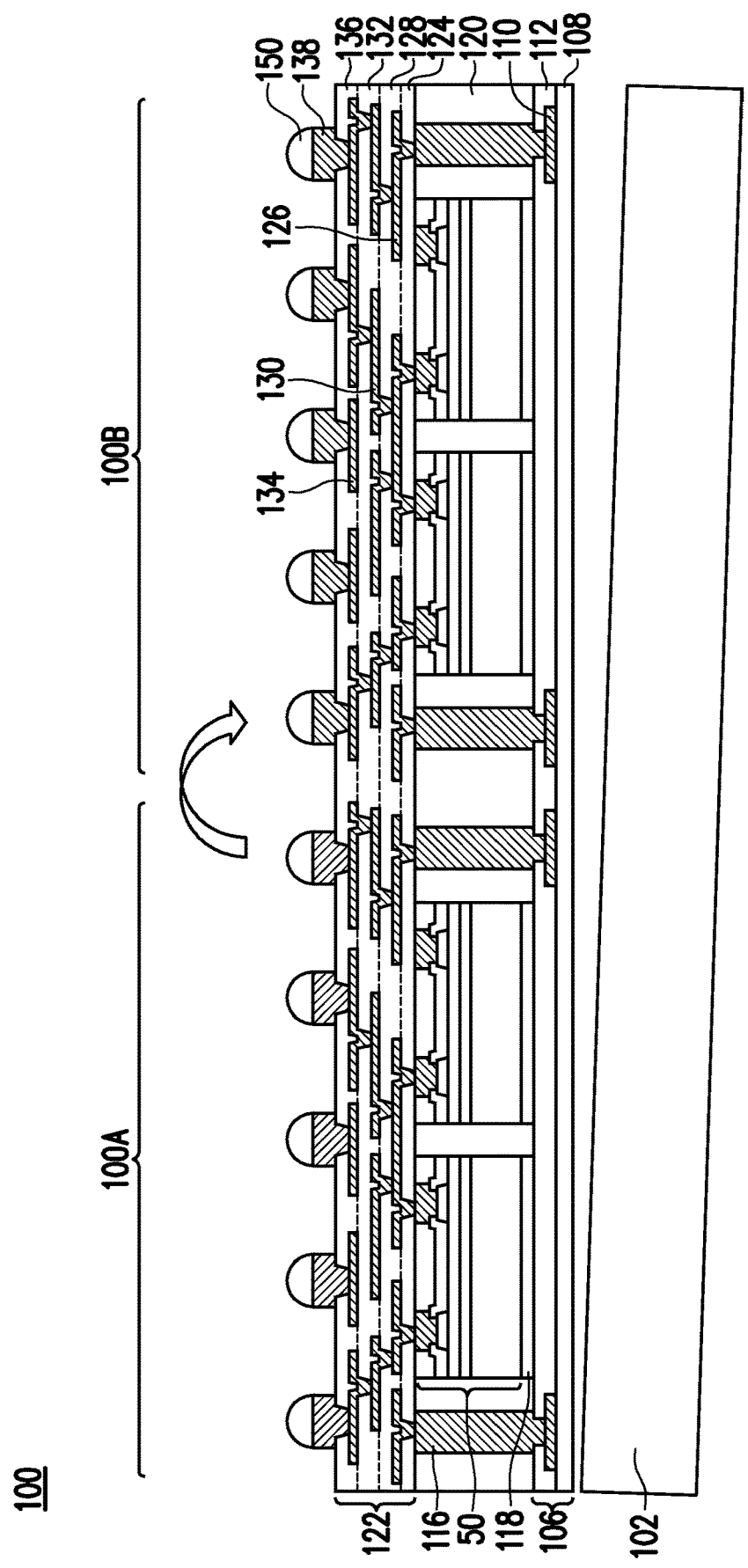

In FIG. 19, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 20:
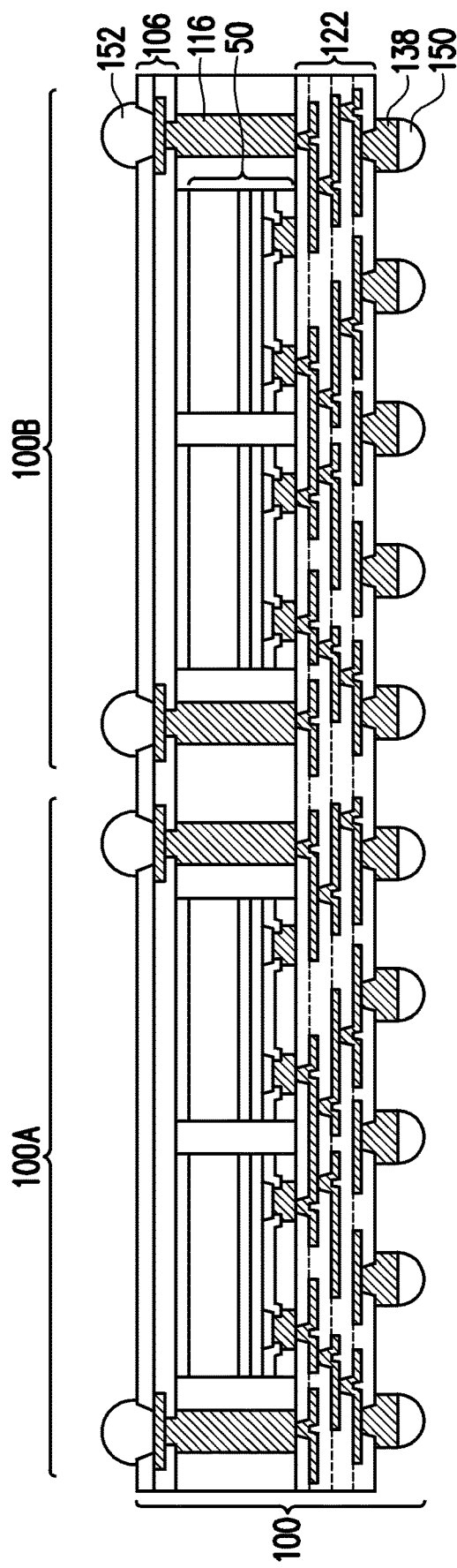

In FIG. 20, conductive connectors 152 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150.

Figure 21:
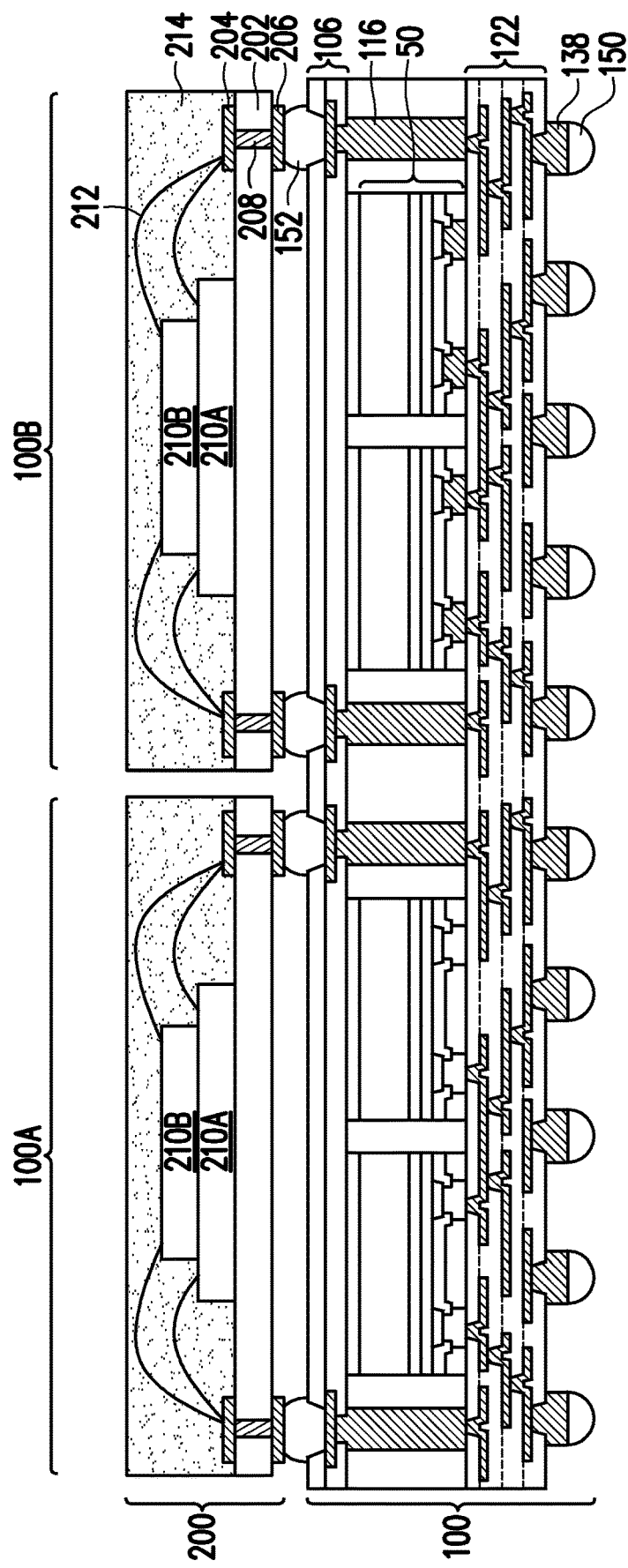
FIGS. 21 and 22 illustrate formation and implementation of device stacks, in accordance with some embodiments.
Figure 22:
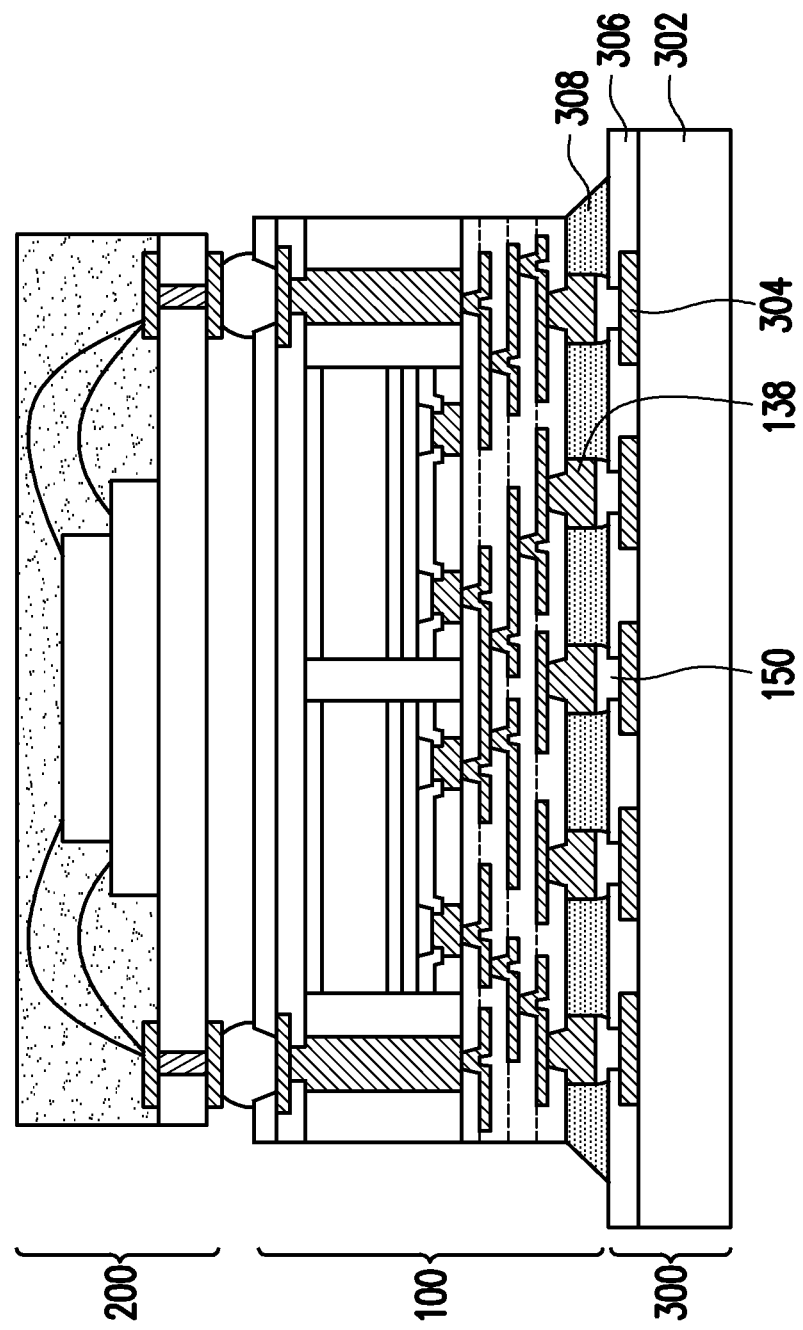

FIGS. 21 and 22 illustrate formation and implementation of device stacks, in accordance with some embodiments. The device stacks are formed from the integrated circuit packages formed in the first package component 100. The device stacks may also be referred to as package-on-package (PoP) structures. Because the PoP structures include InFO packages, they may also be referred to as an InFO-PoP structures.

In FIG. 21, second package components 200 are coupled to the first package component 100. One of the second package components 200 are coupled in each of the package regions 100A and 100B to form an integrated circuit device stack in each region of the first package component 100.

The second package components 200 include a substrate 202 and one or more stacked dies 210 (210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In an embodiment, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and the back-side redistribution structure 106. In some embodiments, the stacked dies 210 may be coupled to the integrated circuit dies 50A and 50B through the wire bonds 212, the bond pads 204 and 206, conductive vias 208, the conductive connectors 152, the back-side redistribution structure 106, the through vias 116, and the front-side redistribution structure 122.

In some embodiments, a solder resist is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux formed thereon before they are reflowed with at least some of the epoxy portion of the epoxy flux remaining after the second package components 200 are attached to the first package component 100.

In some embodiments, an underfill is formed between the first package component 100 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

In FIG. 22, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments, the singulation process is performed before the second package components 200 are coupled to the first package component 100, such as after the carrier substrate 102 is de-bonded and the conductive connectors 152 are formed.

Each singulated first package component 100 is then mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not illustrated) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

It should be appreciated that the first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 23:
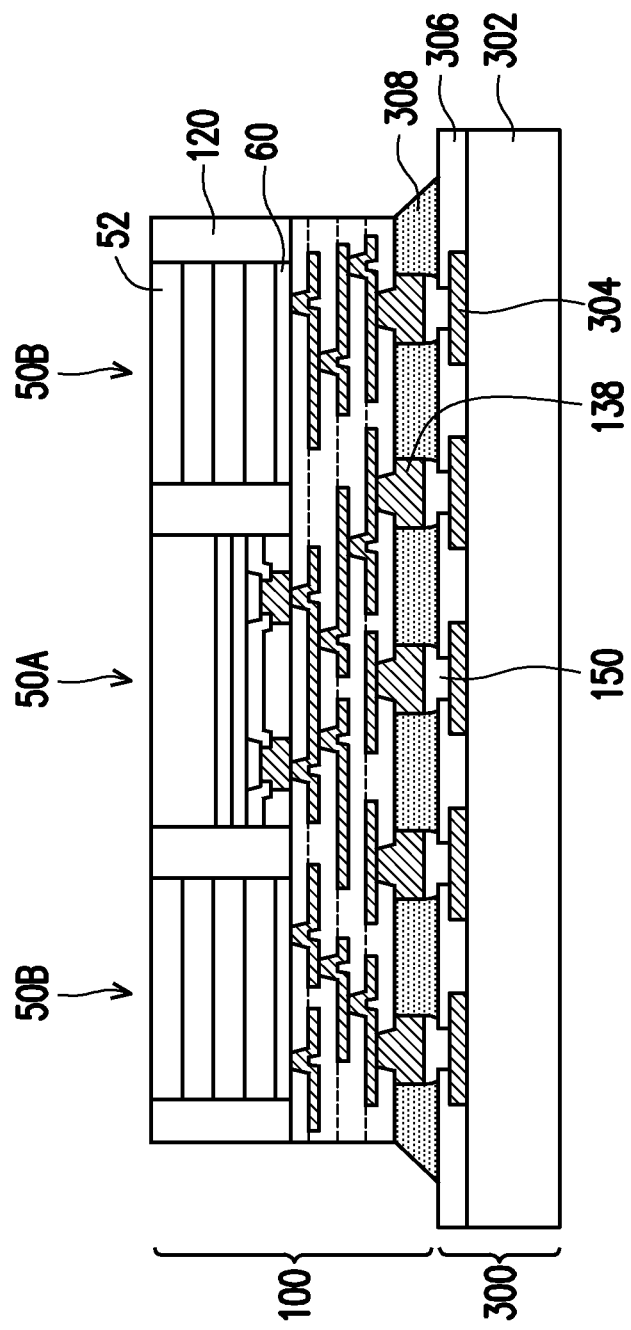
FIG. 23 illustrates a device stack, in accordance with some other embodiments.

FIG. 23 illustrates a device stack, in accordance with some other embodiments. In this embodiment, the back-side redistribution structure 106, through vias 116, and second package components 200 are omitted. Further, the first package component 100 includes one first integrated circuit die 50A (e.g., a logic device) and multiple second integrated circuit dies 50B (e.g., memory devices). The second integrated circuit dies 50B in this embodiment are stacked devices such as memory cubes that include multiple semiconductor substrates 52 and an interconnect structure 60.

Embodiments may achieve advantages. The first package component 100 and package substrate 300 may have mismatched coefficients of thermal expansion (CTE). The difference may be large. For example, in some embodiments, the first package component 100 may have a CTE in the range of 10 to 30 ppm, and the package substrate 300 may have a CTE in the range of 3 to 17 ppm. A large CTE difference causes mechanical stresses to be exerted on the front-side redistribution structure 122 during testing or operation. The increased thickness of the dielectric layer 136 allows the dielectric layer 136 to buffer the mechanical stresses. Cracking and delamination in the front-side redistribution structure 122 may thus be avoided, and the average widths of the UBMs 138 may be reduced. By decreasing the average widths of the UBMs 138, the amount of the metallization pattern 134 contacted by the UBMs 138 may be decreased. The amount of the metallization pattern 134 available for signal routing may thus be increased. Reducing the widths of the UBMs 138 also reduces the risk of solder bridging between the UBMs 138 by the conductive connectors 150.

In an embodiment, a device includes: an integrated circuit die; an encapsulant at least partially encapsulating the integrated circuit die; a conductive via extending through the encapsulant; a redistribution structure on the encapsulant, the redistribution structure including: a metallization pattern electrically coupled to the conductive via and the integrated circuit die; a dielectric layer on the metallization pattern, the dielectric layer having a first thickness of 10 µm to 30 µm; and a first under-bump metallurgy (UBM) having a first via portion extending through the dielectric layer and a first bump portion on the dielectric layer, the first UBM being physically and electrically coupled to the metallization pattern, the first via portion having a first width, a ratio of the first thickness to the first width being from 1.33 to 1.66.

In some embodiments of the device, the first bump portion has a second width, a ratio of the second width to the first width being at least 2.5. In some embodiments of the device, the first width is from 20 µm to 25 µm. In some embodiments of the device, the second width is from 70 µm to 105 µm. In some embodiments of the device, the first bump portion has a second thickness, a ratio of the second thickness to the first thickness being at least 1.5. In some embodiments of the device, the second thickness is from 10 µm to 40 µm. In some embodiments of the device, the metallization pattern has a third thickness, a ratio of the first thickness to the third thickness is at least 6. In some embodiments of the device, the third thickness is from 0.8 µm to 4 µm. In some embodiments of the device, the redistribution structure further includes: a second UBM having a second via portion extending through the dielectric layer and a second bump portion on the dielectric layer, the second UBM being physically and electrically coupled to the metallization pattern, the second via portion having a second width, the second width being greater than the first width by at least 5 µm. In some embodiments of the device, the first UBM further has a second via portion extending through the dielectric layer, a portion of the dielectric layer is between the first via portion and the second via portion, and the first via portion and the second via portion of the first UBM contacting a same landing pad of the metallization pattern. In some embodiments of the device, the second via portion has a same width as the first via portion. In some embodiments of the device, the second via portion has a second width, the second width being is greater than the first width by at least 5 µm. In some embodiments of the device, the first bump portion, the first via portion, and the second via portion of the first UBM have a same shape in a top-down view. In some embodiments of the device, the first bump portion of the first UBM has a first shape in a top-down view, and the first via portion and the second via portion of the first UBM have a second shape in the top-down view, the first shape being different from the second shape.

In an embodiment, a method includes: forming a conductive via extending from a carrier substrate; placing an integrated circuit die adjacent the conductive via; encapsulating the integrated circuit die and the conductive via with an encapsulant; depositing a first dielectric layer on the encapsulant; patterning first openings in the first dielectric layer exposing the integrated circuit die and the conductive via; forming a metallization pattern in the first openings and along the first dielectric layer, the metallization pattern electrically coupling the conductive via and the integrated circuit die; depositing a second dielectric layer on the metallization pattern, the second dielectric layer having a first thickness of 10 µm to 30 µm; patterning a second opening in the second dielectric layer exposing the metallization pattern, the second opening having a first width, a ratio of the first thickness to the first width being from 1.33 to 1.66; and forming a first under-bump metallurgy (UBM) in the second opening and along the second dielectric layer, the first UBM being physically and electrically coupled to the metallization pattern.

In some embodiments, the method further includes: patterning a third opening in the second dielectric layer exposing the metallization pattern, and forming the first UBM further includes forming the first UBM in the third opening. In some embodiments, the method further includes: patterning a third opening in the second dielectric layer exposing the metallization pattern, the third opening having a second width, the second width being less than the first width; and forming a second UBM in the third opening and along the second dielectric layer, the second UBM being physically and electrically coupled to the metallization pattern.

In an embodiment, a method includes: forming a conductive via extending from a carrier substrate; placing an integrated circuit die adjacent the conductive via; encapsulating the integrated circuit die and the conductive via with an encapsulant; forming a metallization pattern electrically coupling the conductive via and the integrated circuit die; depositing a dielectric layer on the metallization pattern; patterning first openings in the dielectric layer exposing a landing pad of the metallization pattern, each of the first openings having a different width; and forming a mask over the dielectric layer, the mask having a second opening exposing each of the first openings; and plating an under-bump metallurgy (UBM) in the first openings and the second opening, portions of the UBM in the first openings each having a first shape in a top-down view, a portion of the UBM in the second opening having a second shape in the top-down view, the second shape being different from the first shape.

In some embodiments of the method, the dielectric layer has a first thickness of 10 µm to 30 µm. In some embodiments of the method, a ratio of the first thickness to the width of each of the first openings is from 1.33 to 1.66.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a through via extending from a carrier substrate;
    placing an integrated circuit die adjacent the through via;
    encapsulating the integrated circuit die and the through via with an encapsulant;
    depositing a first dielectric layer on the encapsulant;
    patterning first openings in the first dielectric layer exposing the integrated circuit die and the through via;
    forming a metallization pattern in the first openings and along the first dielectric layer, the metallization pattern electrically coupling the through via and the integrated circuit die;
    depositing a second dielectric layer on the metallization pattern, the second dielectric layer having a first thickness;
    patterning a second opening in the second dielectric layer exposing the metallization pattern, the second opening having a first width, a ratio of the first thickness to the first width being from 1.33 to 1.66, the second opening having a first shape in a top-down view;
    depositing a seed layer in the second opening and on the second dielectric layer;
    forming a mask on the seed layer, the mask having a third opening exposing the seed layer in the second opening, the third opening having a second shape in the top-down view, the second shape being different from the first shape;
    plating a conductive material in the second opening and the third opening, the conductive material plated on the seed layer; and
    removing the mask and exposed portions of the seed layer to form a first under-bump metallurgy (UBM) comprising remaining portions of the seed layer and the conductive material, the first UBM having a first via portion in the second opening and having a first bump portion in the third opening, the first UBM being physically and electrically coupled to the metallization pattern.

2. The method of claim 1 further comprising:
    patterning a fourth opening in the second dielectric layer exposing the metallization pattern, wherein the conductive material is further plated in the fourth opening.

3. The method of claim 1 further comprising:
    patterning a fourth opening in the second dielectric layer exposing the metallization pattern, the fourth opening having a second width, the second width being less than the first width, the seed layer deposited in the fourth opening, the mask having a fifth opening exposing the seed layer in the fourth opening, the conductive material plated in the fourth opening and the fifth opening, wherein removing the mask and the exposed portions of the seed layer further forms a second UBM, the second UBM having a second via portion in the fourth opening and having a second bump portion in the fifth opening, the second UBM being physically and electrically coupled to the metallization pattern.

4. The method of claim 1, wherein the first thickness is 10 µm to 30 µm.

5. A method comprising:
    forming a through via extending from a carrier substrate;
    placing an integrated circuit die adjacent the through via;
    encapsulating the integrated circuit die and the through via with an encapsulant;
    forming a metallization pattern electrically coupling the through via and the integrated circuit die;
    depositing a dielectric layer on the metallization pattern;
    patterning the dielectric layer according to a first pattern, the first pattern having first portions, each of the first portions of the first pattern having a different first width, the patterning forming first openings in the dielectric layer corresponding to the first portions of the first pattern, the first openings in the dielectric layer exposing a first landing pad of the metallization pattern;
    forming a mask over the dielectric layer, the mask having a second opening exposing each of the first openings; and
    plating a first under-bump metallurgy (UBM) in the first openings and the second opening, portions of the first UBM in the first openings each having a first shape in a top-down view, a portion of the first UBM in the second opening having a second shape in the top-down view, the second shape being different from the first shape.

6. The method of claim 5, wherein the dielectric layer has a first thickness of 10 µm to 30 µm.

7. The method of claim 6, wherein a ratio of the first thickness to the first width of each of the first openings is from 1.33 to 1.66.

8. The method of claim 7, wherein the first landing pad has a second thickness, and a ratio of the first thickness to the second thickness is from 3.5 to 10.

9. The method of claim 8, wherein the portion of the first UBM in the second opening has a third thickness, and a ratio of the third thickness to the first thickness is from 1.5 to 2.33.

10. The method of claim 6, wherein the portion of the first UBM in the second opening has a second width, and a ratio of the second width to the first width of each of the first openings is from 2.5 to 3.6.

11. The method of claim 6 further comprising:
patterning third openings in the dielectric layer exposing a second landing pad of the metallization pattern, the mask having a fourth opening exposing each of the third openings; and
plating a second UBM in the third openings and the fourth opening, portions of the second UBM in the third openings each having a third shape in the top-down view, a portion of the second UBM in the fourth opening having a fourth shape in the top-down view, the fourth shape being different from each of the third shape and the second shape.

12. The method of claim 11, wherein at least one of the third openings has a different width than at least one of the first openings.

13. A method comprising:
encapsulating an integrated circuit die with an encapsulant, the integrated circuit die comprising a die connector;
depositing a first dielectric layer over the encapsulant and the integrated circuit die;
patterning a first opening in the first dielectric layer;
forming a first metallization pattern having a first landing pad portion, a second landing pad portion, and a first via portion, the first via portion disposed in the first opening, the first via portion connected to the die connector of the integrated circuit die, the first landing pad portion and the second landing pad portion extending along the first dielectric layer, the first landing pad portion and the second landing pad portion having a first thickness;
depositing a second dielectric layer on the first metallization pattern and the first dielectric layer, the second dielectric layer having a second thickness over the first landing pad portion and the second landing pad portion, a ratio of the second thickness to the first thickness being from 3.5 to 10;
patterning a second opening and a third opening in the second dielectric layer, the second opening exposing the first landing pad portion of the first metallization pattern, the second opening having a first width, a ratio of the second thickness to the first width being from 1.33 to 1.66, the third opening exposing the second landing pad portion of the first metallization pattern, the third opening having a second width, the second width being greater than the first width, a ratio of the second thickness to the second width being from 1.33 to 1.66;
forming a first under-bump metallurgy (UBM) having a first bump portion and a second via portion, the second via portion disposed in the second opening, the first bump portion extending along the second dielectric layer, the first bump portion having a third width and a third thickness, a ratio of the third thickness to the second thickness being from 1.5 to 2.33; and
forming a second UBM having a second bump portion and a third via portion, the third via portion disposed in the third opening, the second bump portion extending along the second dielectric layer, the second bump portion having the third width and the third thickness.

14. The method of claim 13 further comprising:
patterning a fourth opening in the second dielectric layer, the fourth opening exposing the first landing pad portion of the first metallization pattern, the fourth opening having a fourth width, a ratio of the second thickness to the fourth width being from 1.33 to 1.66,
wherein the first UBM has a fourth via portion disposed in the fourth opening.

15. The method of claim 14, wherein the first width is different from the fourth width.

16. The method of claim 14, wherein the first width is the same as the fourth width.

17. The method of claim 13, wherein the first bump portion has a first shape in a top-down view, and the second opening has a second shape in the top-down view, the second shape being different from the first shape.

18. The method of claim 13, wherein the first bump portion has a first shape in a top-down view, and the second opening has a second shape in the top-down view, the second shape being the same as the first shape.

19. The method of claim 13, wherein the first bump portion has a first shape in a top-down view, and the second bump portion has a second shape in the top-down view, the second shape being different from the first shape.

20. The method of claim 13, wherein the first bump portion has a first shape in a top-down view, and the second bump portion has a second shape in the top-down view, the second shape being the same as the first shape.

* * * * *